United States Patent [19]
Patterson

[11] Patent Number: 4,802,225
[45] Date of Patent: Jan. 31, 1989

[54] ANALYSIS OF NON-SINUSOIDAL WAVEFORMS

[75] Inventor: Roy Patterson, Great Shelford, England

[73] Assignee: Medical Research Council, London, England

[21] Appl. No.: 814,321

[22] Filed: Dec. 30, 1985

[30] Foreign Application Priority Data

Jan. 2, 1985 [GB] United Kingdom ................. 8500006

[51] Int. Cl.[4] ............................................. G10L 9/00
[52] U.S. Cl. ........................................ 381/41; 381/48; 381/49; 324/77 R
[58] Field of Search ....................... 381/41, 45, 46, 47, 381/48, 49; 324/77 R, 77 A; 364/484

[56] References Cited

U.S. PATENT DOCUMENTS

| | | | |
|---|---|---|---|
| 3,020,344 | 2/1962 | Prestigiacomo | 324/77 A |
| 3,395,345 | 7/1968 | Rader | 381/49 X |
| 3,657,646 | 4/1972 | Zmyslowski et al. | 324/77 A |
| 3,676,596 | 7/1972 | Willems | 381/49 |
| 4,074,069 | 2/1978 | Tokura et al. | 381/41 |
| 4,091,237 | 5/1978 | Wolnowsky | 381/49 |
| 4,230,906 | 10/1980 | Davis | 381/41 X |
| 4,592,369 | 6/1986 | Davis et al. | 324/77 R X |
| 4,688,464 | 8/1987 | Gibson et al. | 324/77 R X |

Primary Examiner—Patrick R. Salce
Assistant Examiner—Marc S. Hoff
Attorney, Agent, or Firm—Bernard, Rothwell & Brown

[57] ABSTRACT

Apparatus for detecting periodicity in a non-sinusoidal waveform comprises a peak detector for detecting peaks in a waveform, a signal generator for generating a succession of signals corresponding to detected peaks and a signal analyser including a signal plotter arranged to input a succession of signals corresponding to detected peaks and to plot time duration since input of each signal against a logarithmic to the base 2 representation of time.

13 Claims, 10 Drawing Sheets

ANALYSIS OF NON-SINUSOIDAL WAVEFORMS

The invention relates to apparatus for and methods of analysing non-sinusoidal waveforms. It is particularly applicable to the detection of periodicity in a waveform.

BACKGROUND OF THE INVENTION

Analysis of non-sinusoidal waveforms is particularly applicable to speech recognition systems. Some speech processors begin the pitch extraction process by dividing the speech wave into separate frequency channels, either using Fourier Transform methods or a filter bank that mimics that encountered in the human auditory system to a greater or lesser degree. This is done to make the speech recognition system noise resistant.

In the Fourier Transform scheme small segments of the wave are transformed successively from the time domain to the frequency domain, and the components in the resulting spectrum are analysed to see if they comprise a harmonic series. The fundamental of the series provides an estimate of the pitch of the speech at that moment. This approach is relatively economical, but it has the disadvantage that it destroys the temporal information in the speech wave before it has been completely analysed.

In the filter-bank method the speech wave is divided into channels by filters operating in the time domain, and the result is a set of waveforms each of which carries some portion of the original speech information. The temporal information in each channel is analysed separately and then a combined estimate of the pitch of the speech is calculated. These methods are very complex and there are difficulties in providing sufficient resolution for optimum pitch extraction.

Simple speech recognition systems, which employ pitch extractors that operate on the raw waveform in the time domain, are inefficient and susceptible to disruption by background noise.

SUMMARY OF THE PRESENT INVENTION

Although not limited to sound waves, the present invention is particularly suited to the analysis of sound waves and to the detection of periodicity in a sound wave. It is particularly useful in distinguishing between periodic and aperiodic sounds. It is also applicable to the detection of pitch in periodic sound waves.

The invention is applicable to the analysis of sound waves representing musical notes or speech. In the case of speech the invention is particularly useful for a speech recognition system in which it permits detection of pitch and may be used to distinguish between periodic signals representing voiced parts of speech and aperiodic signals which may be caused by noise.

The invention may be used to determine the period of isolated spectral components, e.g. the fundamental frequency, and its harmonics, and envelope frequencies in a waveform. It may be used to provide an indication of timbre as well as pitch.

The present invention provides apparatus for detecting periodicity in a non-sinusoidal waveform comprising (a) means for detecting major peaks in the waveform (b) means for generating a plurality of signals representing times at which said major peaks are detected, (c) means for comparing the occurrence of said signals with time and (d) means for detecting any sequence of two or more signals wherein the time interval between any two signals in the sequence after the first signal in the sequence is double the time interval prior to the occurrence of the previous signal in the sequence, and thereby to indicate periodicity in the waveform.

It will be understood that the expression "peaks" refers to changes in direction of the waveform whether they occur at the top or bottom of the waveform and regardless of whether the value of the waveform is positive or negative where the change in direction occurs.

Preferably said means for comparing the occurrence of said signals with time provides an indication of signal occurrence against a logarithmic (base 2) representation of time, and said means for detecting a sequence of two or more signals comprises means for indicating the occurrence of signals at times having a common mantissa value in said logarithmic representation.

Preferably said means for comparing the occurrence of signals with time provides a logarithmic (base 2) spiral plot of said signals whereby signals having periodicity form one or more linearly aligned groups.

Preferably said apparatus includes means for determining the orientation of any such linearly aligned groups, relative to the spiral, for indicating the pitch of the periodic waveform.

Preferably the means for generating signals representing the detection of major peaks comprises means for generating an electronic pulse train, each pulse representing a major peak.

In one embodiment said apparatus is arranged for the analysis of sound waves and includes filtering means arranged to select a frequency or frequency band whereby an indication of periodicity is provided for that frequency or frequency band.

Preferably said apparatus includes a plurality of filter means arranged to provide a plurality of frequency channels together with means for indicating the pitch of waveforms in each of said channels.

Preferably means is provided to form a pulse train representing the major peaks in the waveform of each of said channels.

Preferably means is provided to adjust the phase of each channel pulse train whereby the signals from each channel may be phase aligned.

Preferably said apparatus includes means for combining the pitch indication for each of said channels in order to provide an overall pitch assessment.

The aforesaid apparatus may include frequency channels for a fundamental and harmonic frequencies for a non-sinusoidal signal together with means for combining said signals on a spiral plot.

Preferably means is arranged to respond to one or more patterns of signal locations on said spiral plot representing harmonic wave components in order to provide an indication of timbre.

Preferably means is provided to form a cyclic aggregate of the pulse trains for each channel, at the pitch frequency of the waveform, thereby indicating timbre of the waveform.

The invention includes a method of detecting periodicity in a waveform which method comprises detecting major peaks in a waveform, generating a plurality of signals representing the time occurrences of said peaks, comparing the occurrence of said signals with time and indicating periodicity by detecting any sequence of two or more signals where the time interval between any two signals in the sequence after the first signal in the sequence is double the time interval before the occurrence of the previous signal in the sequence. Preferably said method includes detecting the basic time interval of any such sequence of signals to provide an indication of pitch.

The present invention includes apparatus for distinguishing between periodic and aperiodic sound signals, said apparatus including apparatus as aforesaid for detecting periodicity in a sound wave. Preferably said apparatus includes means for selecting waveforms having a detected periodicity and rejecting waveforms which do not have such periodicity.

The invention also provides speech recognition apparatus including means for analysing sound waves representing spoken words, and means as aforesaid for detecting periodicity in a sound wave. Preferably said apparatus includes means for indicating pitch in sound waves incorporating speech signals together with speech feature extraction means for providing an indication of speech features in said waveforms.

Preferably the apparatus includes a linguistic processor for providing an indication of the words detected by the analysis of the waveform.

BRIEF DESCRIPTION OF THE DRAWINGS

FIGS. 11, 12 and 13 illustrate the waveform of three sound waves which all sound the same, FIG. 12 being a pulse train whereas FIG. 13 is similar to FIG. 11 although in the reverse direction with respect to time.

DESCRIPTION OF THE PREFERRED EMBODIMENTS

Although the invention is applicable to the analysis of any oscillations which can be represented by a non-sinusoidal waveform, the examples described below relate more specifically to sound waves. They provide apparatus for detecting waveform periodicity and separating periodic waves from aperiodic waves. Periodic sound waves include those forming the vowels of speech, notes of music, the calls of animals, and there are other examples such as the purring of motors and pumps and the warning signals used in transport vehicles and factories. Background noises like those produced by wind, rain, waves and computers are aperiodic sounds.

The following embodiments of the invention which can be used to distinguish between periodic and aperiodic sound signals are particularly applicable to speech recognition systems. By use of this invention the efficiency with which speech features can be extracted from an acoustic waveform may be enhanced such that speech recognition may be used even on small computers, dictating machines, or automatic typing or printing apparatus so that a user can input commands, programs and text directly by spoken word without the need of a keyboard.

A speech recognition machine is a system for capturing speech from the surrounding air and producing an ordered record of the words carried by the acoustic wave. The main components of such a device are (1) a filter bank which divides the acoustic wave into frequency channels, (2) a set of devices that process the frequency channels to extract pitch and other speech features, and (3) a linguistic processor that analyses the features in conjunction with linguistic and possibly semantic knowledge to determine what was originally said.

This embodiment includes improved means of implementing the second of the three components in the speech recognition machine. More particularly, by use of a processor herein called a spiral processor, it provides improved extraction of pitch information from the speech wave and the exploitation of this information in the derivation of the remaining speech features. Recognition systems are known in which pitch is derived in the frequency domain. In this example all of the features are derived in the time domain and pitch is the vital feature which is necessary to calibrate and combine the frequency channels so that the remaining speech features can be extracted efficiently.

The Approach of the present embodiment to the Pitch Extraction Problem

To extract vowel pitch, the speech processor of this example does four things passively and automatically: (a) detects periodicity in either the fine structure or the envelope of each and every frequency channel coming out of the filter bank, (b) attenuates channels with energy but no periodicity, (c) extracts periodicity information as it exists in the ensemble of frequency channels, and d) combines all the periodicity information, independent of form, into an overall estimate of pitch.

THE SPIRAL PROCESSOR

In order to describe the function of the spiral processor of these embodiments, further explanation will be given of the way in which the auditory system responds to periodic and aperiodic sounds. Pitch is our perception of the periodicity in a sound wave. Periodic sounds produce regular streams of nerve impulses in the auditory system whereas aperiodic sounds do not. The spiral processor of these examples provides a convenient means of detecting and evaluating periodicity in a sound wave. The spiral processor is passive and quick, two characteristics that are essential for the peripheral auditory system.

Figure 2:
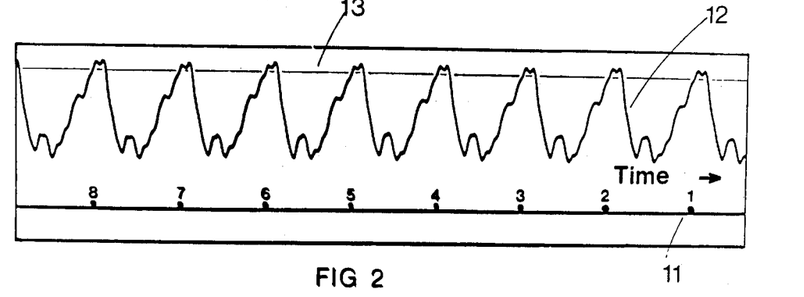
FIG. 2 illustrates the sound wave produced by a guitar playing the note C3 and a stream of eight pulses produced by a pulse generator which fires each time the wave exceeds its threshold.

The basis of the spiral processor will be described with reference to FIGS. 2, 3 and 4. FIG. 2 illustrates the sound wave produced by a guitar playing the note C3. The waveform shows how the air pressure rises and falls regularly as the note progresses with time. The wave repeats 131 times each second and it is this that makes it the note C3. The details of the waveform within the cycle are specific to the guitar and to this instrument in particular. The nerves in the ear fire in synchronism with periodic waves as long as the firing rate is fairly low. Thus the output of a single nerve listening to this guitar would be a stream of regularly spaced pulses like that illustrated at 11 on the time line below the wave 12. The line 13 near the top of the wave 12 indicates the pressure at which each nerve cell fires when listening to this sound wave.

Figure 3:
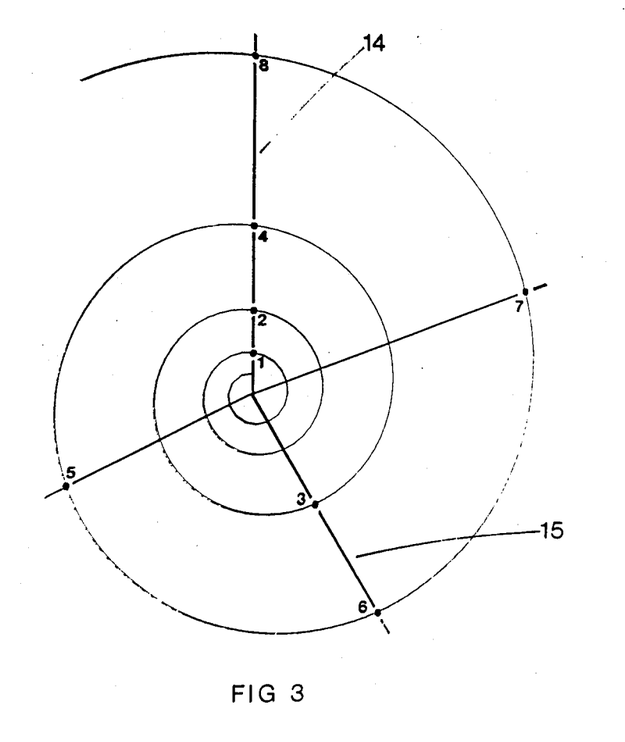
FIG. 3 is a spiral plot of the pulses shown in FIG. 2 in which the time line of the pulses forms a spiral which doubles it length on each circuit around the spiral.

The spiral spoke pattern is obtained in FIG. 3 by wrapping the time line of the pulses in FIG. 2 into a spiral that doubles its length once per circuit; that is, a logarithmic spiral with base two. The spiral is a temporal window; the pulses flow in at the centre, around the spiral, and out at the top. For a regular stream, the pulses coalesce onto the spoke pattern of the spiral once per cycle. When the pulse rate changes the spoke pattern rotates as a unit. That is the angles between spokes remains fixed and so the orientation of the pattern determines the periodicity of the pulse stream.

Time progresses along the path of the spiral from the centre outwards, and so the most recent pulse to have been generated appears at the centre of the spiral. At this particular instant in time, four of the eight pulses in the stream line up on one spoke 14 of the spiral, the vertical spoke proceeding from the origin upwards. They are pulses 1, 2, 4 and 8. Two more pulses, numbers 3 and 6, line up on a spoke 15 that goes from the origin downwards and somewhat to the right. The remaining two pulses, numbers 5 and 7, occupy individual spokes.

The angles between the spokes are the same no matter what the note; it is only the orientation of the spoke pattern that changes when the pitch is altered. As we raise the pitch of the note, the peaks in the wave get closer together and the pulse stream is compressed with the result that the spokes on the spiral rotate clockwise and become shorter. Thus, checking for this pattern of spokes at different orientations serves to detect and classify the periodicity of incoming sounds.

Figure 4:
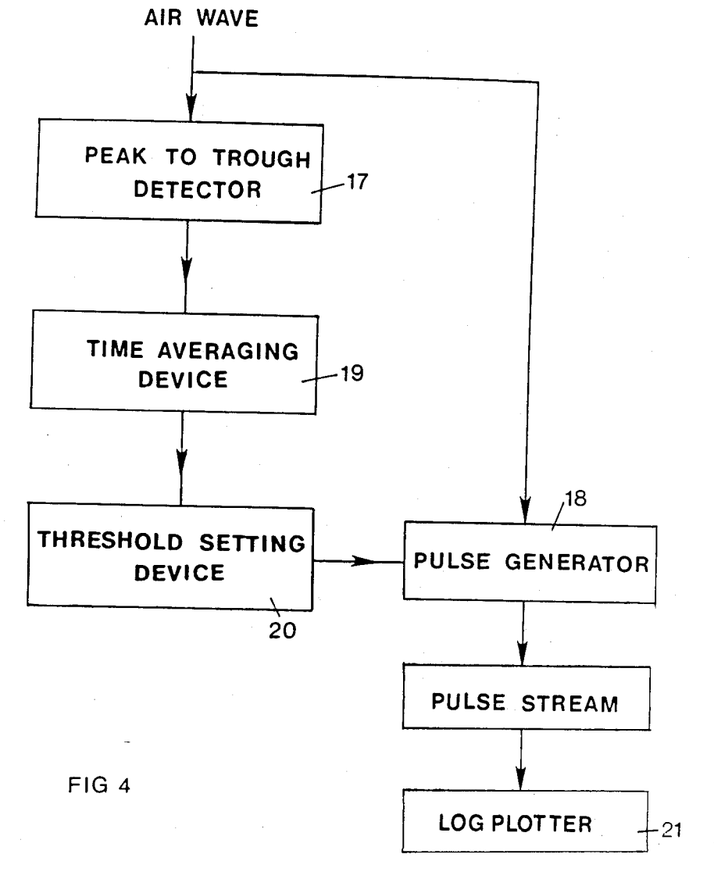
FIG. 4 is a block diagram of apparatus for use in generating a spiral plot of the type shown in FIG. 3 by generating a pulse stream of the type shown in FIG. 2.

FIG. 4 illustrates schematically an embodiment for generating a spiral plot of the type shown in FIG. 3 from an airwave of the type shown in FIG. 2. The airwave is fed to a peak to trough detector 17 and to an electrical pulse generator 18. The detector 17 may include a transducer arranged to process the signals in electrical form corresponding to the variations in the airwave. The detector 17 provides an indication of the variation in signal level between the peaks and troughs in the waveform and this is supplied to a time averaging device 19. The average signal variation over a plurality of cycles is fed to a threshold setting device 20 to determine the threshold in each cycle at which the pulse generator 18 generates a pulse. In this way the pulse generator 18 generates a sequence of pulses similar to the sequence illustrated in FIG. 2 thereby representing in relation to time the occurrences of major peaks in the waveform. In the case of an unmodulated wave, all the peaks will be treated as major peaks so that a pulse will be produced for each peak provided the frequency of the waveform is not in excess of the firing rate of the pulse generator 18. For modulated waveforms, the threshold setting device 20 will set a level dependent on the time averaged variation between peaks and troughs such that firing occurs for each major peak while avoiding firing for minor peaks such as occur in any carrier wave frequency for a modulated wave. The use of the threshold setting device 20 also permits the pulse generation to be independent of any overall amplitude variations of the sound signal with time. The pulse stream is supplied from the pulse generator 18 to a log (base 2) plotter 21 which provides the spiral plot of the type shown in FIG. 3. The log plotter 21 may comprise a suitably programmed computer with visual display of known type. As previously indicated, the detection of pulses in alignment on spokes in the spiral display indicate periodicity in the waveform and the angular alignment of those spokes gives an indication of the pitch.

It will be appreciated that the log (base 2) plot is a particularly convenient way of detecting any succession of pulses wherein the time interval between any two signals in the sequence after the first signal in the sequence is double the time interval prior to the occurrence of the previous signal in the sequence.

It will therefore be understood that in other embodiments the geometric spiral or a spiral equation for extracting spiral periodicity from a pulse stream may be replaced by other arrangements that monitor the pulse stream and simultaneously check for a range of doubling time relationships between the pulse times. The advantage of the spiral is that is provides an efficient means of detecting doubling relationships. That is, one can detect time doublings by taking the logarithm of the pulse times to the base two and checking to see if there are sets of pulse times whose logarithms have a common mantissa. (The "mantissa" is the fractional part of the logarithm and the "characteristic" is the integer part). For example, the base-two logs of the eight pulses shown on the spiral in FIG. 3 are, from the centre out, 0.00, 1.00, 1.59, 2.00, 2.32, 2.59, 2.83 and 3.00. (The centre pulse is taken to be one time unit from the origin). Four of the pulses have the mantissa value 0.00 and two of the pulses have the mantissa value 0.59, indicating that there are two groups of pulse times related by power-of-two at this moment. Thus, the spiral reduces the doubling detector to a "common mantissa" detector which is simpler to implement.

The planar, base-two spiral provides a visual representation of the process that relates the flow of time to doubling relationships among the pulse times; spokes emanating from the centre of the spiral show all the doubling relationships contained within the duration represented by the spiral's length. It is a good representation of the process primarily because the mantissa of the logarithm of time is the angle of the spoke associated with that time. Coalescence of a set of pulses onto a spoke indicates that the logarithms of these pulse times currently have common mantissas.

The primary difference between a pitch detector based on spiral processing and other periodicity mechanisms, like Fourier analysis or autocorrelation, is again the fact that a spiral processor detects time doublings rather than evenly spaced events. As a result, the first stage of spiral processing does not use all of the available information in its initial pitch estimate; only four of the eight pulses coalesce onto the main spoke. However, the spiral processor has the advantage that it checks for all pitches simultaneously. There is no need for a subsequent stage involving a harmonic sieve or similar mechanism to reassemble the various components generated in the analysis.

The above description has referred to the treatment of a single pulse train derived from one waveform. In order to simulate the analysis carried out in the human auditory system it is necessary for the pitch assessment to be carried out on a plurality of channels derived from spectral analysis of the sound wave. Periodic sounds such as a vowel have energy distributed across a wide range of harmonics. In order to assess the pitch of the original wave, the speech recognition apparatus provides an indication of pitch for the fundamental of the harmonic series.

Figure 1:
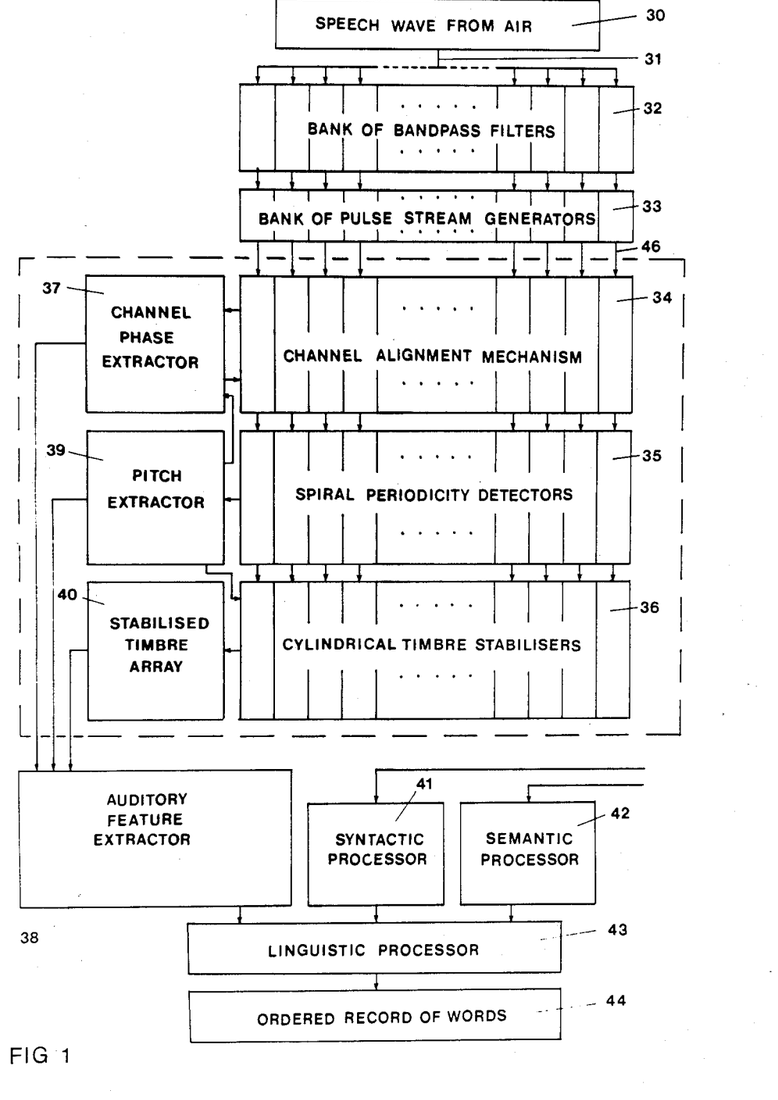
FIG. 1 is a schematic illustration of voice recognition apparatus in accordance with the invention.

A speech recognition apparatus in accordance with the invention is illustrated in block form in FIG. 1. This illustrates a speech wave 30 derived from surrounding air which forms an electric signal 31 fed to a bank of band pass filters 32. In this example the filter bank 32 provides 24 frequency channels which vary from a low frequency of 100 Hz to a high frequency of 3700 HZ. The signals from all of these channels are fed to respective pulse generators 33 so as to form a pulse stream for each channel, representing the major peak formations in the waveform transmitted by each of the filters in the bank 32. The pulse streams are fed to respective channels of a channel alignment mechanism 34. The aligned pulse streams are then fed to a spiral periodicity detector 35 having one channel corresponding to each of the filters in the filter bank 32. The spiral periodicity detectors are connected to respective channels of cylindrical timbre stabilisers 36. The channel alignment mechanism 34 has input and output connections to a channel phase extractor 37 which is also arranged to provide an output to an auditory feature extractor 38. The spiral periodicity detectors provide an output to a pitch extractor 39 which also provides an output to the auditory feature extractor 38 as well as a signal to the cylindrical timbre stabilisers 36. The cylindrical timbre stabilisers 36 provide an output to a stabilised timbre array 40 which also provides an output to the auditory feature extractor 38. In addition a syntactic processor 41 is provided as well as a semantic processor 42. The auditory feature extractor 38, syntactic processor 41 and semantic processor 42 each provide inputs to a linguistic processor 43 which in turn provides an output 44 in the form of an ordered record of words.

Figure 5:
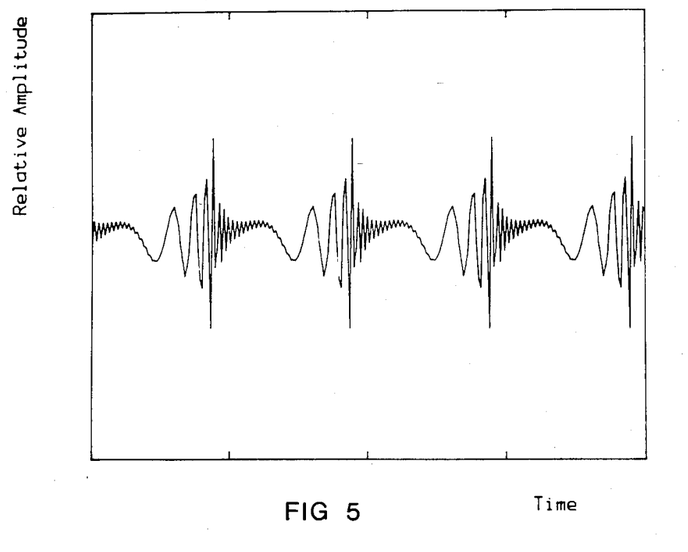
FIG. 5 represents the waveform of a monotonic phase wave, FIG. 6 indicates a subset of six driving waves derived by spectral analysis of the waveform of FIG. 5.
Figure 6:
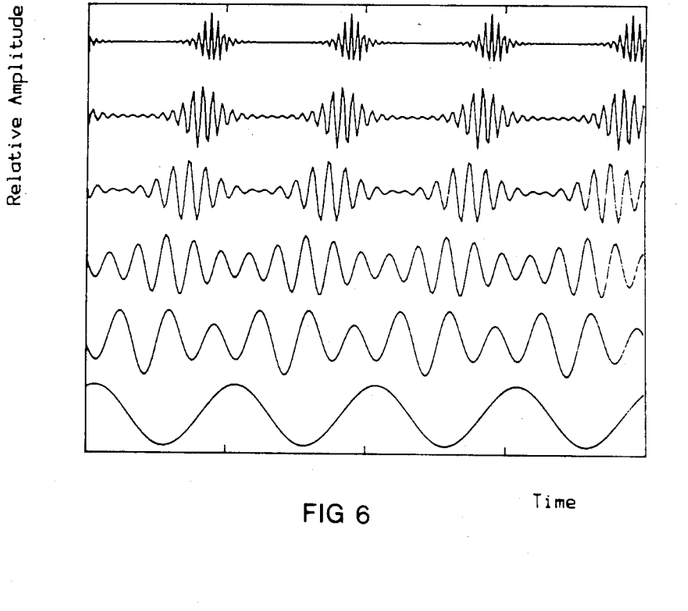

The function of the various components will be further described with reference to FIGS. 5 to 18. For simplicity of understanding the description will relate to the sound wave shown in FIG. 5 which is similar to a bassoon playing a note whose pitch is just below C3 although the principle is the same with the voiced parts of speech. The waveform in FIG. 5 is a periodic wave with a fundamental of 125 cps in which all the harmonics are present at equal amplitude. It is a monotonic phase wave in which the waveform repeats every 8 milliseconds. Spectral analysis of this waveform is effected by the 24 channel filter bank 32 so as to provide 24 driving waves a quarter of which have been illustrated in FIG. 6. The spectral analysis is presented as a set of driving waves rather than a simple power spectrum as the speech recognition apparatus uses the temporal information in the driving waves that would otherwise be lost in the construction of a power spectrum. For simplicity only six of the constituent driving waves have been illustrated in FIG. 6. This spectral analysis is similar to that effected by the cochlear mechanism in the human auditory system. The six waves shown in FIG. 6 are spread fairly evenly across the spectrum and represent about every sixteenth member of the set of driving waves. As can be seen from FIG. 6, those driving waves that oscillate slowly as illustrated by the bottom three waveforms have peaks that are roughly equal in amplitude and the shape of the driving wave is an approximation to sinusoidal. The driving waves further up the spectrum oscillate faster and they are modulated in that successive peaks of the wave increase and decrease in a regular fashion over time. The modulation rate is the same for all of the modulated channels, that is, the time between maximum amplitude peaks is the same for all of the high frequency driving waves. Furthermore, the maximum amplitude peak occurs later in time on going to the higher frequency waveforms illustrated in FIG. 6. The use of this spectral analysis improves the systems ability to detect signals in the presence of environmental noise whenever the spectrum of the signal and the spectrum of the background noise differ. It improves the accuracy of pitch measurements and it provides for an orderly description of the timbre of the sound in terms of the spectral content, that is a description in terms of which driving waves are present and which are absent.

Figure 7:
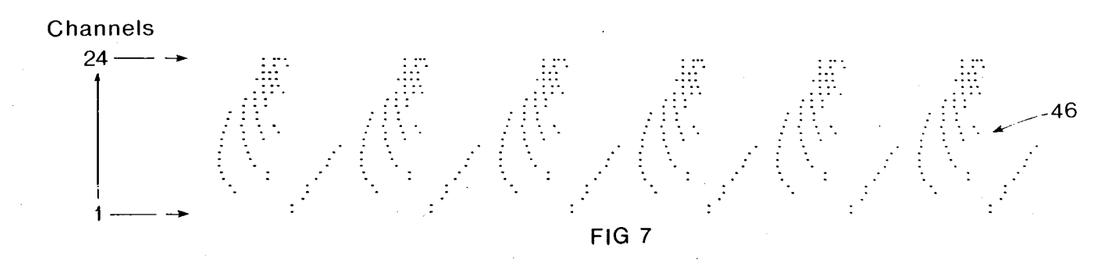
FIG. 7 illustrates six successive cycles of a pulse stream ensemble having twenty four channels derived by twenty four waves of the type shown in FIG. 6.

The device described provides a means of combining the information derived from the independent channels. Each of the driving waves is supplied to a respective pulse stream generator in the bank of generators 33. The pulse stream generator for each channel is arranged to generate a succession of pulses similar to that previously described with reference to FIGS. 2 and 3, such that the pulse stream represents the time occurrences of major peaks in the waveform handled by that channel. The collective output 46 from the bank of pulse stream generators 33 forms a pulse stream ensemble which is illustrated in FIG. 7. FIG. 7 illustrates six successive cycles wherein the pulse train for each of channels 1 to 24 is represented by the horizontal sequence of dots with the bottom line representing channel 1 and the top horizontal line representing channel 24. The horizontal displacement represents time. Channel 24 represents the highest frequency driving wave and channel 1 the lowest frequency. It can be seen from the inclination of the dot pattern that the major peaks in the higher frequency waves are phase shifted relative to the major peaks in the lower frequency waves. For the low frequency driving waves where the waveform is essentially sinusoidal and the modulation is not too great, the pulse stream generator produces a pulse for each cycle of the driving wave. As the driving wave frequency increases the pulse stream generator responds to the modulation of the driving wave such that the low amplitude peaks are not represented in the pulse stream and only the major peaks cause pulse generation. It can therefore be seen that the high frequency driving waves produce pulse streams in which bursts of pulses occur at regular intervals and the time between bursts is the period of the original sound. It can therefore be seen that in this case the spectral analysis results in unmodulated driving waves at the bottom end of the spectrum and modulated driving waves at the top end of the spectrum. The period of the modulator is the same for all of the modulated channels but the time of the modulator maximum varies with the driving wave. Aperiodic waves associated with environmental noises also contain energy across a range of frequencies. In this case however all of the driving waves exhibit modulation even those with the lowest oscillation rates and the modulation peaks are not regular. Nor is there any correspondence between the modulators of different driving waves. To separate periodic sound sources from aperiodic sound sources the pulse stream generators should therefore preserve information concerning the modulation of the driving waves. It is also the case that the resolution of pitch and the resolution of timbre extraction are enhanced to the extent that the pulse generators fire in synchronism with the driving waves.

Figure 8:
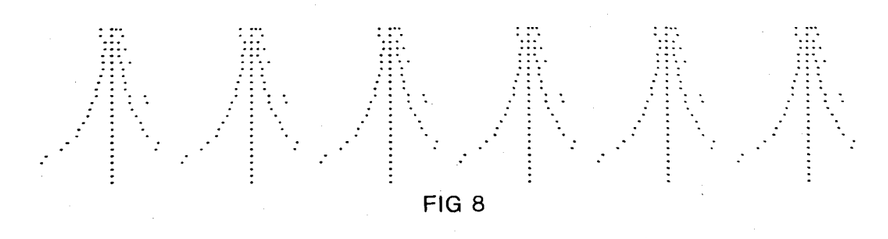
FIG. 8 illustrates an aligned pulse stream ensemble derived by phase alignment of the pulse streams in the channels of FIG. 7.
Figure 11:
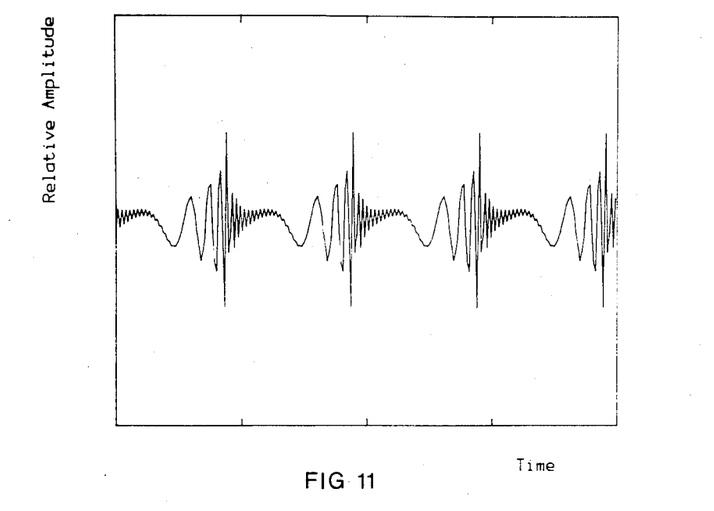
Figure 12:
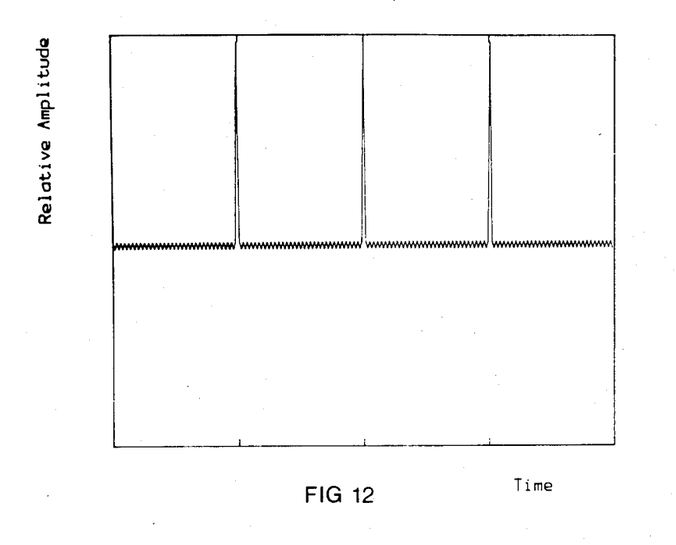
Figure 13:
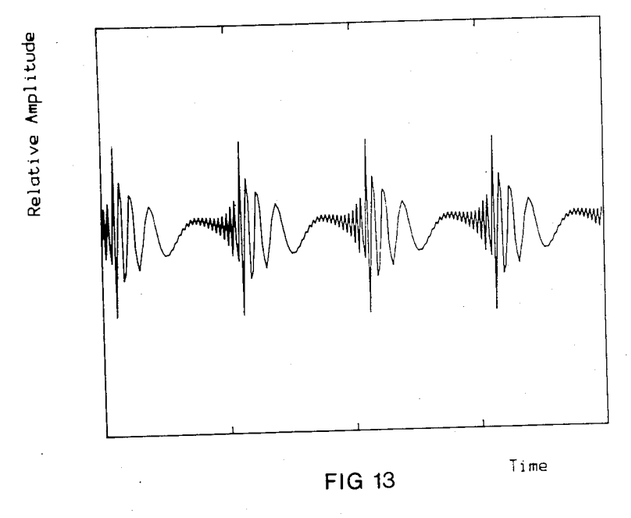
Figure 14:
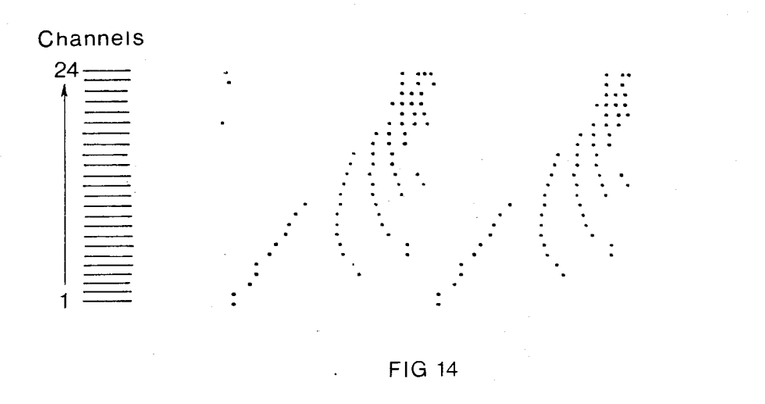
FIGS. 14, 15 and 16 illustrate the phase differences in the pulse stream ensembles derived from the waveforms of FIGS. 11, 12 and 13 respectively.
Figure 15:
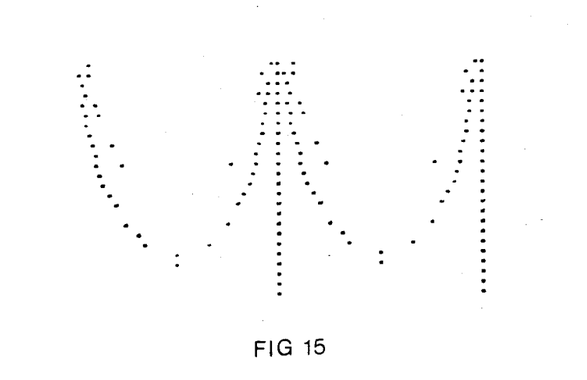
Figure 16:
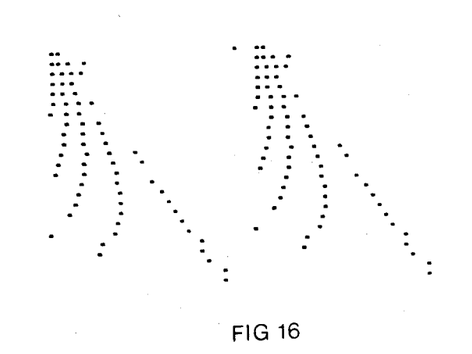

The channel alignment mechanism 34 is provided to permit relative phase adjustment of the pulse streams in each of the channels. By permitting phase alignment between each of the pulse streams it is possible to avoid erroneous interpretation of the pulse streams due to distortion of the phase spectrum of sound during transmission from the source to the receiver. In order to identify a sound reliably the system must correctly generalise across the waveform changes associated with transmission distortions. This will be further described with reference to FIGS. 11 to 16. FIG. 11 shows the sound wave similar to that of FIG. 5. FIG. 13 shows the same sound wave played backwards in time. FIG. 12 is a simple pulse train. These three waves all sound the same to the human ear. They have identical power spectra with a fundamental of 125 Hz with all harmonics present up to 3000 Hz and all components with equal amplitude. The three sounds generate virtually identical driving waves but the shift of the modulator on moving across the frequency range of the driving waves varies for the three sounds. This can be seen from the pulse stream ensembles in FIGS. 14, 15 and 16 which are derived from the waveforms of FIGS. 11, 12 and 13 respectively. For the waveform of FIG. 12, the modulator does not drift as the frequency of the driving waves vary so that the pulse stream ensemble shown in FIG. 15 has natural phase alignment across the channels. In the case of FIG. 14 the peaks for the lower frequencies have drifted to the left indicating that the peaks of these lower frequencies were detected earlier than the higher frequencies. For the pulse ensemble shown in FIG. 16, the pulses representing major peaks in the lower frequencies have moved to the right indicating later detection than for the peaks of the higher frequencies. Since these three waves all sound the same, the apparatus includes the channel alignment mechanism 34 to shift the relative phase of the pulse streams to eliminate the differences between the pulse stream ensembles. This is illustrated in FIG. 8 which shows the same time sequence for six cycles of the pulse streams running horizontally for each of the twenty four channels. In other words FIG. 8 shows the modification of FIG. 7 once phase alignment has occurred. The channel alignment mechanism 34 consists of a plurality of pulse time shifting devices. For each channel it estimates the modulator peak times by scanning the individual pulse streams and noting bursts of pulses spaced by gaps. The time at the centre of the burst of pulses provides an estimate of the modulator peak time. The modulator peak estimates for all of the modulated channels can then be averaged by the channel phase extractor 37. This average is then fed back to the alignment mechanism 34 and each separate channel then shifts its associated pulse stream left or right in the pulse stream ensemble of FIG. 7 to align the nearest modulator peak in the pulse train with the mean peak time. When this process of alignment is applied to the pulse streams derived from the waveform of FIG. 12 it has no effect because the pulse streams are already aligned. The pulse streams derived from the waveforms of FIGS. 11 and 13 are however moved in opposite directions so that they become aligned and thereby indistinguishable. In an alternative, the phase alignment may be achieved by using a feedback from the pitch extractor 39 to the channel phase extractor 37 so that the time differences in pitch extraction for each channel are used to effect the appropriate channel phase adjustment.

Figure 9:
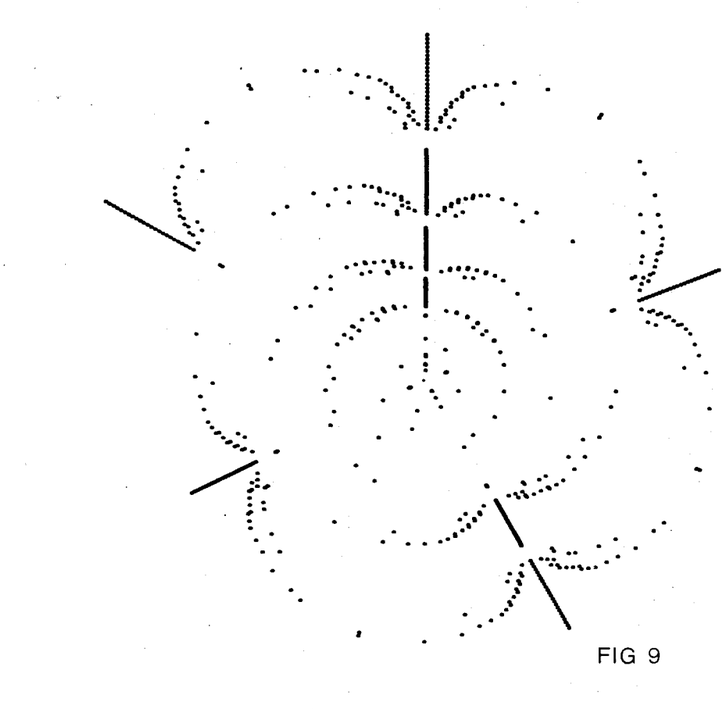
FIG. 9 is a spiral plot of the aligned pulse stream ensemble of FIG. 8

The aligned pulse streams are then supplied to each of the channels of the spiral periodicity detectors 35. Each channel includes a device for providing a spiral log (base 2) plot or alternatively a device for calculating the log (base 2) of the time of occurrence of the pulse together with means for detecting any sequence of pulses wherein time doubling occurs between successive pulses. In the case of a spiral plot, the combined effect is shown in FIG. 9. This shows the spiral plot for all channels simultaneously and the occurrence of various pulses on aligned spokes indicates periodicity and therefore pitch. The pitch extractor 39 is arranged to indicate that pitch has been detected and to derive from the orientation of the spokes an estimate of the pitch value based on all frequencies used as a result of the spectral analysis. The outermost spiral thread carries the information from the lowest frequency driving waves and the innermost spiral thread carries the information from the highest frequency driving waves. The spiral is derived from use of a temporal window of approximately 75 milliseconds in duration and it shows the pulse streams from a nine cycle section of the original wave. In this particular case the pattern is derived from the waveform of FIG. 5 and the orientation of the aligned spokes corresponds to the note C3.

If the low frequency energy from the sound is removed (that is the energy at the fundamental frequency), the lowest frequency driving waves and their corresponding pulse streams would drop out and the spiral ribbon would lose its outermost pair of threads. This would however have only a marginal effect on the spoke pattern and it would still be possible to detect and identify the pitch as C3. It will be seen that the spiral periodicity detector 35 provides a log (base 2) representation of the aligned pulse stream ensemble in relation to time. The extension of the single channel spiral detector into a multi channel arrangement enables the model to explain the pitch of the missing fundamental and related phenomena. Periodic sounds with harmonics produce an ensemble of modulated driving waves and pulse streams. The modulated channels automatically contribute to the low pitch associated with the period of the sound without the need of a harmonic sieve or other calculations because their bursts of pulses are spaced by large gaps and the gaps suppress pitch estimates associated with the individual driving wave frequencies. The pitch extractor 39 may be arranged to provide a visual indication of the spiral pattern shown in FIG. 9. Spiral flow of this pattern may be removed from the visual display by arranging for the pitch extractor 39 to provide information about the pitch pattern only when the instantaneous pitch estimate is relatively high. In other words the display may be blank most of the time and only flash on briefly when the radial bars coalesce into spokes. As the rate of coalescence is 60 Hz or more even for low notes like C2 the resulting display may be a stable spoke pattern which persists as long as the period of the sound is fixed.

Figure 10:
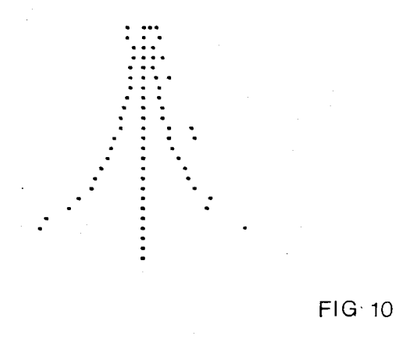
FIG. 10 illustrates a cylindrical plot of the aligned pulse stream ensemble of FIG. 8 thereby providing an aggregate of a plurality of cycles for the pulse trains of FIG. 8, the cycles being at the pitch frequency of the waveform.

The cylindrical timbre stabilisers 36 are arranged in combination with the stabilised timbre array 40 to provide timbre extraction which is used to characterise the quality of an incoming sound independent of the pitch and any non-essential phase distortions in order to assist in categorising and identifying the sound source. Once the pitch extractor 39 has determined the period of the sound, a stabilised timbre image can be constructed by wrapping the aligned pulse stream ensemble around a cylinder whose circumference equals the period. The cylindrical timbre stabilisers 36 receive the aligned pulse streams and overlay cycles so as to aggregate the pulse pattern for a succession of cycles at the pitch frequency. The effect of the cylindrical timbre stabilisers 36 can be seen from FIG. 10 in which the cylindrical mapping causes a time delay equal to the period of the pitch of the note such that pulses from successive cycles of the aligned pulse stream ensemble fall on top of each other in the cylindrical plot. By making a multi cycle aggregate of the pulse pattern for each of the channels a multi cycle estimate of the timbre may be made. FIG. 10 illustrates the aggregate pulse pattern for nine successive cycles of the twenty four channel pulse stream ensemble derived from the waveform of FIG. 5. The Figure illustrates the planar result of a cylindrical plotting system wherein the period of revolution of the cylinder is equal to the pitch period. To achieve cylindrical mapping a plotter pen may be set moving at a constant speed relative to the plotting paper and arranged to return to its starting point at the beginning of each cycle of the record. When the record is periodic and has precisely the period swept out by the pen, then successive cycles of the pulse stream record fall on top of each other. To the extent that the period of the wave varies, the image is blurred and in the case of white noise the result is a rectangular random dot pattern.

Figure 17:
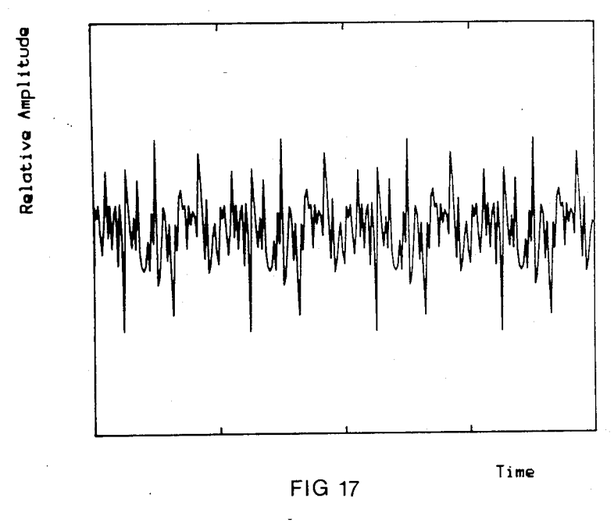
FIG. 17 illustrates the sound waveform of a non-monotonic phase wave having the same fundamental frequency as the waveform of FIGS. 5 and 11 but a different timbre.
Figure 18:
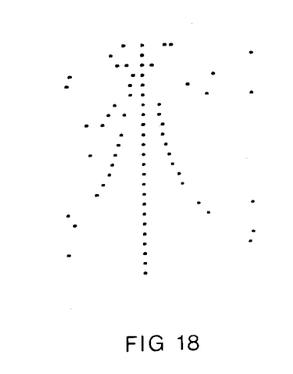
FIG. 18 illustrates the cylindrical plot of an aligned pulse stream ensemble derived from the waveform of FIG. 17.

The strongest determinant of timbre is the spectral distribution of the sounds energy. When a harpsichord and a piano play the note C3 the harpsichord generates more high frequency energy. The output of the stabilised timbre array 40 will therefore produce more active high frequency channel signals than for a piano. The relative strength of the adjacent harmonics also affects timbre and contributes to the piano/harpsichord distinction. In the display of the type shown in FIG. 10, odd or even harmonics of a sound may be attenuated so that the smooth arches flanking the main column of the timbre pattern shown in FIG. 10 become jagged like a staircase because the stronger harmonics come to dominate the driving waves of channels either side of their own frequency. Consequently the display of FIG. 10 can encode local spectra differences. This can be further explained with reference to FIGS. 17 and 18. Although spectral differences are the strongest determinants of timbre, the relative phase of the components of the harmonic sound also affects sound quality. For example, if a non-monotonic phase wave is constructed using a fundamental of 125 cps and all its harmonics up to 3000 Hz with successive components assigned phases between 0 and 360 degrees at random, the result is a wave like that shown in FIG. 17. This has a pitch just below the note C3 as for the wave of FIG. 5, but it has a raspier timbre than the monotonic phase waves or the pulse train. The output of the stabilised timbre array 40 for the waveform of FIG. 17 is illustrated in FIG. 18. It can be seen that there are distinct differences between this and the array shown in FIG. 10 derived from the waveform of FIG. 5. The difference in the array is an indication of the difference in timbre. By suitable use of template matching in the device, the output array derived from the unit 40 can be used to provide an indication of timbre.

With further reference to FIG. 1, the auditory feature extractor 38 may incorporate a memory device providing templates of various timbre arrays of the type previously discussed in relation to FIGS. 10 and 18. It also receives an indication of the orientation of any spokes detected by the spiral processor and is thereby able to indicate pitch of the sound. It will be appreciated that the inputs to the auditory feature extractor 38 have a spectral dimension and so the feature extractor can make vowel distinctions on the basis of formant information like any other speech system. Similarly it can distinguish between fricatives like /f/ and /s/ on a quasi-spectral basis. The advantage of the current arrangement is that it avoids discarding the temporal information in the frequency channels as soon as the statistic associated with pitch has been determined and so permits additional feature extraction in the time domain.

The linguistic processor 43 derives an input from the feature extractor 38 as well as inputs from a syntactic processor 41 which stores rules of language and imposes restrictions to help avoid ambiguity. The processor also receives an input from the semantic processor 42 which imposes restrictions dependent on context so as to help determine particular interpretations depending on the context.

In the above example, the units 34, 35, 36, 37, 39 and 40 may each comprise a programmed computing device arranged to process pulse signals in accordance with the program. The feature extractor 38, and processors 41, 42 and 43 may each comprise a programmed computer or be provided in a programmed computer with memory means for storing any desired syntax or semantic rules and template for use in timbre extraction.

I claim:

1. Apparatus for detecting periodicity in a non-sinusoidal waveform comprising (a) a peak detector for receiving said waveform and for detecting peaks in the waveform, (b) a signal generator coupled to said peak detector for generating a succession of signals each at a time corresponding to a respective detected peak, and (c) a signal analyser coupled to the signal generator and including a signal plotter coupled to input a succession of said signals at times corresponding to the detected peaks and to plot time duration since input of each signal against a logarithmic to the base 2 representation of time, and detector means for indicating occurrence of signals at times having a common mantissa value in said logarithmic representation.

2. Apparatus according to claim 1 wherein said signal plotter provides a spiral plot of signal plotter provides a spiral plot of said signals whereby signals having periodicity from on or more linearly aligned groups.

3. Apparatus according to claim 2 including means for determining the orientation of any such linearly aligned groups, relative to the spiral, for indicating the pitch of the periodic waveform.

4. Apparatus according to claim 1 arranged for the analysis of a sound wave, said apparatus further including a filter arranged to select a plurality of frequency channels together with pitch indicators for indicating the pitch of waveforms in each of said channels.

5. Apparatus according to claim 4 further including means for combining the pitch indication for each of said channels in order to provide an overall pitch assessment.

6. Apparatus according to claim 4 wherein means is provided to form a pulse sequence representing the major peaks in the waveform of each of said channels.

7. Apparatus according to claim 6 including means for adjusting the phase of each channel pulse train whereby said pulse trains may be phase aligned.

8. Apparatus according to claim 4 wherein means is provided to form a cyclic aggregate of the pulse trains for each channel, at the pitch frequency of the waveform, thereby providing an indication of timbre of the waveform.

9. Speech recognition apparatus including apparatus according to claim 5 together with means for providing auditory feature extraction from analysis of the waveform together with syntactic and semantic processor means providing semantic and syntactic limitations for use in determining speech analysis from the sound wave.

10. Speech recognition apparatus according to claim 9 further including means for indicating the timbre of the waveform together with template matching means for comparing said timbre indication with recorded timbre patterns.

11. A method of detecting periodicity in a waveform which method comprises detecting peaks in a waveform, generating a succession of signals each at a time corresponding to a respective detected peak, inputting said signals to a signal plotter and plotting time duration since input of each signal against a logarithmic to the base 2 representation of time, and indicating the occurrence of signals at times having a common mantissa value in said logarithmic representation, thereby providing an indication of periodicity in the waveform.

12. A method according to claim 11, said method including detecting the basic time interval of any said succession of signals to provide an indication of pitch.

13. An apparatus for detecting periodicity in a non-sinusoidal waveform comprising
    means for detecting peaks in the waveform to generate a corresponding pulse train,
    means for determining three or more pulses in the pulse train having a time relationship wherein the three or more pulses have successive increasing time intervals between the three or more pulses, said successive increasing time intervals being logarithmic to a base of two, and
    means responsive to the determining means to indicate periodicity in the waveform.

* * * * *